United States Patent [19]

Yamauchi et al.

[11] Patent Number: 4,549,199
[45] Date of Patent: Oct. 22, 1985

[54] SEMICONDUCTOR DEVICE PROVIDING A CONTACT STRUCTURE WHICH CAN BE MINIATURIZED

[75] Inventors: Takahiko Yamauchi; Teruo Seki, both of Kawasaki; Keizo Aoyama, Yamato, all of Japan

[73] Assignee: Fujitsu Limited, Kawasaki, Japan

[21] Appl. No.: 513,611

[22] Filed: Jul. 14, 1983

[30] Foreign Application Priority Data

Jul. 24, 1982 [JP] Japan ................................. 57-129177

[51] Int. Cl.[4] ...................... H01L 23/48; H01L 29/04; H01L 29/06
[52] U.S. Cl. ........................................ 357/68; 357/59; 357/20; 357/71
[58] Field of Search ........................ 357/68, 59, 20, 71, 357/65

[56] References Cited

U.S. PATENT DOCUMENTS 4,084,108 4/1978 Fujimoto .................................. 357/59
4,376,983 3/1983 Tsaur et al. ............................ 357/59

FOREIGN PATENT DOCUMENTS 50-40835 12/1975 Japan .

OTHER PUBLICATIONS

IEEE Journal of SSC, "A 30 NS 16K×1 Fully Static RAM", by Kang et al., vol. SC-16, No. 5, Oct. 1981, pp. 444–448.

Primary Examiner—Martin H. Edlow
Assistant Examiner—Terri M. Henn
Attorney, Agent, or Firm—Staas & Halsey

[57] ABSTRACT

A semiconductor device comprises a connection structure composed of a first conductive layer formed in or on a semiconductor substrate, a second conductive layer arranged adjacent to the first conductive layer, and a third conductive layer connecting the first conductive layer to the second conductive layer. The device of the present invention provides a contact structure which can be miniaturized.

12 Claims, 9 Drawing Figures

SEMICONDUCTOR DEVICE PROVIDING A CONTACT STRUCTURE WHICH CAN BE MINIATURIZED

BACKGROUND OF THE INVENTION

1. Field of the Invention

The present invention relates to a semiconductor device. More particularly, the present invention relates to a semiconductor device comprising a contact structure in which two types of conductive layers located adjacent to each other are connected to each other by a third conductive layer pattern extending over these two conductive layers.

2. Description of the Prior Art

In integrated circuits, especially in a metal-insulator semiconductor type of integrated circuit, interconnecting lines consisting of polycrystalline silicon layers are generally used. Due to an increase in the degree of integration of integrated circuits, it has been possible to provide a two-layered polcrystalline layer in a multilevel interconnection structure in order to realize a further increased level of interconnection or in order to utilize the two-layered polycrystalline layer as a resistor. A conventional monolayered polcrystalline structure is of a so-called silicon gate structure in which a so-called buried contact structure is adopted to realize a direct contact between the polycrystalline silicon layer and the source or drain diffused layer as disclosed in Japanese Examined Patent Publication No. 50-40835. This buried structure is advantageous for decreasing the size of the contact portion. However, this structure involves a problem in that the formation of a contact window is necessary before the formation of a polycrystalline silicon layer, i.e., before the formation of a source or drain region. Therefore, for the two-layered polycrystalline silicon structure, there is proposed, in place of the buried contact structure, a contact structure in which the diffused layer and the first polycrystalline silicon layer, which are arranged adjacent to each other, are connected to each other by the second polycrystalline silicon layer pattern extending over these two layers. In any event, the formation of a contact window for the previously formed diffused layer or first polycrystalline silicon layer is necessary before the formation of the second polycrystalline silicon layer. Therefore, even if the above-proposed structure is adopted, the diffused layer and the first polycrystalline silicon layer can be connected to each other without the carrying out of any special additional process. Such a contact structure is known from, e.g., the IEEE Journal Of S.S.C., Vol. SC-16, October 1981, pages 444 to 448.

SUMMARY OF THE INVENTION

It is an object of the present invention to provide a semiconductor device wherein a contact structure can be miniaturized so as to improve the integration degree thereof.

According to the present invention, there is provided a semiconductor device comprising a connection structure composed of a first conductive layer formed in or on a semiconductor substrate, a second conductive layer arranged adjacent to the first conductive layer, and a third conductive layer connecting the first conductive layer and the second conductive layer by being in contact with the first and second conductive layer in a quadrangular contact region which is formed where the first conductive layer is adjacent to the second conductive layer and is defined so as to extend over the first and second conductive layers. The portion of the second conductive layer located within the contact region has a pattern such that the width of the second conductive layer in a direction along one side of the quadrangular contact region is narrower at a certain section of the second conductive layer than at a section thereof spaced from the above-mentioned section along the longitudinal direction of the second conductive layer from the end thereof.

It is preferred that the second conductive layer have a pattern with a square or rectangular shape wherein one corner of the pattern is cut so as to have a triangular shape.

Further, it is preferred that the second conductive layer has a pattern with a square or rectangular shape, wherein one corner of the pattern is cut so as to have a small square or rectangular shape.

BRIEF DESCRIPTION OF THE DRAWINGS

Further advantages and details of the present invention will be apparent from the following description thereof, with reference to the accompanying drawings, in which.

DESCRIPTION OF THE PREFERRED EMBODIMENTS

Before explaining the preferred embodiments of the invention, the prior art is further described.

Figure 1A:
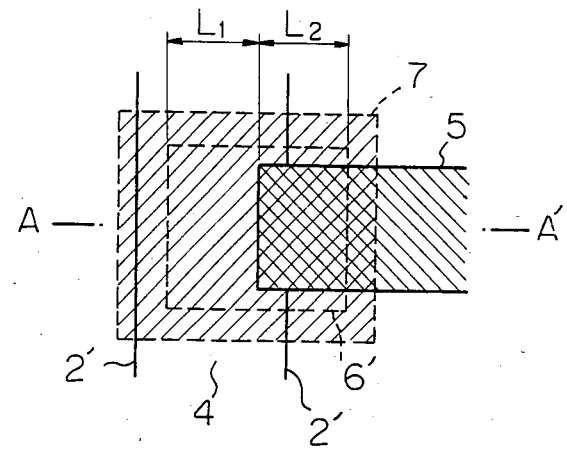
FIG. 1A is a plan view of a contact structure between first and second polycrystalline silicon layers of an n-type source or drain region and according to the prior art.
Figure 1B:
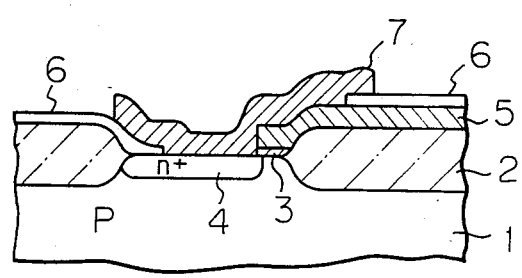
FIG. 1B is a sectional view, takes along line A—A; of the contact structure shwon in FIG. 1A according to the prior art.

An example of a typical layout of the above-mentioned conventional contact structure is shown in FIG. 1A, and a sectional view taken along the line A—A' in FIG. 1A is shown in FIG. 1B. In the drawings, reference numeral 1 denotes a silicon substrate, 2 a thick field oxide layer, 2' an end of the field oxide layer, 3 a gate oxide layer, 4 an N-type region for a source or drain, 5 a first polycrystalline silicon layer, 6 a silicon nitride layer for insulating polycrystalline silicon layers, 6' a contact window open in the silicon nitride layer 6, and 7 a second polycrystalline silicon layer. As is shown in the drawings, the finger portion of the first polycrystalline silicon layer 5 extends so that it is adjacent to the N-type region 4, and the window 6' defining a contact portion, is formed so that it extends over the first polycrystalline silicon layer 5 and the N-type region 4. The second polycrystalline silicon layer 7 is formed in a pattern completely covering the window 6'. Due to this structure, the N-type region 4 is connected to the first polycrystalline silicon layer 5 via the second polycrystalline silicon layer 7. This structure requires no process for forming a contact window before the formation of the first polycrystalline silicon layer 5 and, thus, is advantageous in terms of the production process. However, this structure is disdavantageous in that the area required for the contact portion tends to be large. Since three types of conductive layer patterns are centered in this contact portion, if any of these conductive layers are utilized, other patterns can only be located outside of the required margin of the contact portion, which has a significant influence on the degree of integration of integrated circuits. Furthermore, allowance must be made for a misregistration between the three layers due to the pattern-forming process. Therefore, a significant margin must be set for this misregistration. Referring to FIG. 1A, the window 6' is laid out so as to have a size $L_1$ allowing for a margin to ensure contact with the first N-type region 4 and a size $L_2$ allowing for a margin to ensure contact with the first polycrystalline silicon layer 5. In this case, a margin in a direction perpendicular to the line A—A' is out of the question because the first polycrystalline silicon layer 5 has a width equivalent to or larger than the size $L_1$ or $L_2$, which size $L_1$ or $L_2$ is slightly larger than the misregistration margin, though the layer 5 is mainly used as a gate electrode and has a fine width near the minimum line width in accordance with the gate length. If the width of the window 6' can be made smaller, the width thereof in a direction perpendicular to the line A—A' may be smaller than the width of the first polycrystalline silicon layer 5. In any event, with regard to this direction, it is only necessary that the window-pattern defining the contact region be superposed on the N-type region 4 or the first polycrystalline silicon layer 5, and no special consideration need be given to the misregistration of superposition between the three layer patterns. On the contrary, with regard to the A—A' direction, the misregristration of superposition between the three layer patterns must be taken into consideration. In the conventional layout, the portion having a size $L_1$ and the portion having a size $L_2$ should be juxtaposed in series. Therefore, it is difficult to further reduce the size of the contact structure.

Figure 2:
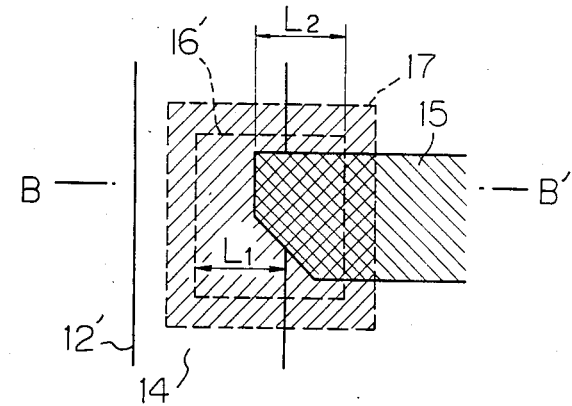
FIG. 2 is a plan view of a contact structure of an embodiment according to the present invention.

FIG. 2 is a plan view of a contact structure according to an embodiment of the present invention. Reference numeral 12' denotes the boundary of an end of a thick field oxide layer, 15 a first polycrystalline silicon layer, 16' a contact window of an insulating layer defining a contact region, and 17 a second polycrystalline silicon layer. As is apparent from the drawings, in accordance with the present invention, the first polycrystalline silicon layer 15 is arranged in the contact window 16' so that the end of the layer 15 is narrow in width, whereby portions sized $L_1$ and $L_2$, respectively, are provided for ensuring contact between the N-type region and the first polycrystalline silicon layer. The sizes allow for a margin for misregistration and contact is ensured because of partial superposition. Therefore, the size of the contact window 16' in the direction of connection of the N-type region 14 and the first polycrystalline silicon layer 15 (corresponding to the line A—A' direction of FIG. 1A) can be remarkably reduced as compared with a conventional contact window. This reduction in size results in a reduced area of the contact region and an enhanced degree of integration of the integrated circuits. In ths regard, it should be noted that the degree of integration of the integrated circuits depends on how closely and densely the surrounding patterns can be arranged around the contact window 16'. For example, if the contact window 16' does not have a rectangular shape so as to reduce the area thereof, it is not always possible to enhance the degree of integration. The surrounding patterns are arranged in parallel to each side of the rectangular contact window 16' at a distance of a specific margin or more. Therefore, the decreased size of the contact region as shown in FIG. 2, is effective for enhancing the degree of integration. Furthermore, it is difficult to make the pattern of the polycrystalline silicon layer 15 more complex so as to ensure the margins for the $L_1$ and $L_2$ portions, because the pattern size thereof must be as small as possible in order to enhance the degree of integration. Since the polycrystalline silicon layer 15 in this embodiment is of a simple pattern such that one corner of the layer 15 is merely cut, it is not necessary to enhance the accuracy of the pattern.

In order to make the contact structure of the present invention more understandable a method for manufacturing the contact structure is described below with reference to FIGS. 3A through 3D, which are sectional views of the contact structure of FIG. 2 in the production processes, the sectional views being taken along the line B—B' in FIG. 2.

Figure 3A:
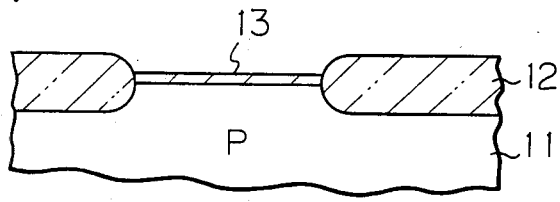
FIGS. 3A through 3D are sectional views, taken along line B—B', of the contact structure shown in FIG. 2 illustrating the manufacturing processes thereof, according to the present invention.

First, a field oxide layer 12 having a thickness of approximately 8,000 Å is formed on a P-type silicon substrate 11 in a predetmined pattern by means of a well-known selective oxidation technique. After the masking layer for selective oxidation is removed, a thermal oxide layer 13 (a gate insulating layer) having a thickness of about 400 Å is formed on the surface of the component regions not covered by the field oxide layer 12. This state is shown in FIG. 3A.

Figure 3B:
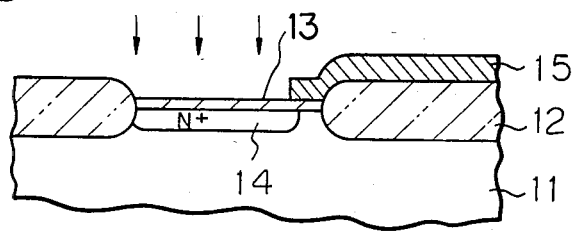

Next, first polycrystalline silicon layer 15 is deposited, at a thickness of approximately 4,000 Å, on the field oxide layer 12 and the thermal oxide layer 13 and is patterned so as to provide a gate electrode and an interconnecting line. By using the pattern of the first polycrystalline silicon layer 15 formed by this pattern-forming step and the field oxide layer 12 as a mask, arsenic ion implantation is carried out to form a source or N-type region 14 (FIG. 3B). The first polycrystalline silicon layer 15 is also doped with arsenic so as to adjust the resistance thereof to a low level. The above-mentioned steps are the same as those used for the formation of a silicon gate by using monolayered polycrystalline silicon except for the step of forming a buried contact.

Figure 3C:
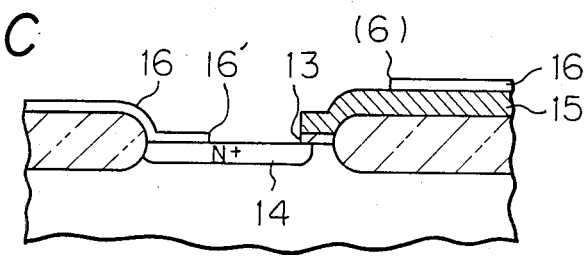

The thus-prepared substrate is subjected to etching to the extent that the oxide layer having a thickness of 400 Å in the source or drain region 14 is completely removed. Thereafter, the deposition of an insulating layer for insulating polycrystalline silicon layers from each other, e.g., a silicon nitride layer 16 having a thickness of 700 Å, is carried out by means of chemical vapor deposition (CVD). The portion of the silicon nitride layer 16 through which a second polycrystalline silicon layer makes contact with the source of drain N-type region 14 is selectively removed so as to form a window 16'(FIG. 3C). Thereafter, the deposition of a second polycrystalline silicon layer 17 having a thickness of approximately 2,500 Å is carried out by means of CVD.

Figure 3D:
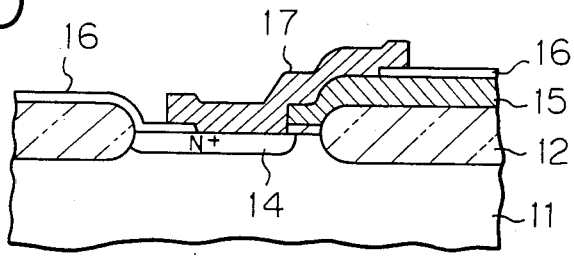

In a case where the second polycrystalline silicon layer 17 is grown by using no doping agent, arsenic ions are subsequently inplanted in the resultant second polycrystalline silicon layer in a predetermined dose so as to adjust the resistivity thereof to a required value. The second polyscrystalline silicon layer 17 is used, for example, as a load resistor. In this case, arsenic ions are implanted in a low dose so as to obtain a high resistivity. A state obtained after pattering of the second polycrystalline silicon layer 17 is shown in FIG. 3D. Even if the second polycrystalline silicon layer 17 has a high resistivity, the source or drain N-type region 14 and the first polycrystalline silicon layer 15 are conductively connected to each other because the region 14 and the layer 15 are formed adjacent to each other. Furthermore, since the first polycrystalline silicon layer 15 is generally used as an interconnecting line for a high-input impedance gate, a little parasitic resistance is negligible.

Thereafter, further steps, such as the formation of an insulating layer, the formatin of a contact window, and the formation of an aluminum electrode, are effected to complete the semiconductor device. An explanation of these steps is omitted since the present invention does not pertain thereto. Also, a step for forming a channel-stop region and an ion implantantion step for controlling the threshold value of the transistor, which steps are usually effected in the course of the steps shown in FIGS. 3A trough 3D, are omitted for the sake of simplicity.

After the step of FIG. 3A, the misregistration of other patterns relative to the already formed pattern may occur in every step of forming the pattern of each layer. Thus, it will be understood that the sizes $L_1$ and $L_2$ shown in FIG. 2 must be determined by allowing for such misregisration.

Figure 4A:
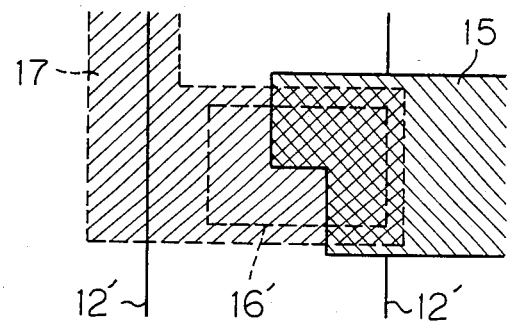
FIGS. 4A and 4B, respectively, are plan views of contact structures show the other embodiments according to the present invention.
Figure 4B:
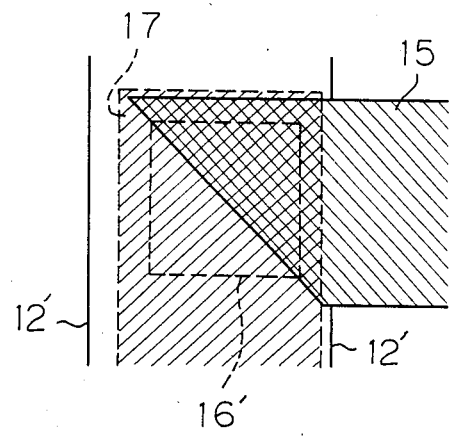

FIGS. 4A and 4B, respectively, are plan views of other embodiments of the present invention. In FIGS. 4A and 4B, the same parts as those shown in FIG. 2 are represented by the same reference numerals. It is apparent from these examples that, in accordance with the present invention, the shape of the first polycrystalline silicon layer 15 within the rectangular contact region (i.e., the rectangular window 16'), the layer 15 being a second conductive layer, is designed so as to have a larger margin by a partial change of the width of the layer. This feature can be easily appreciated by comparing FIG. 1A with, particularly, FIG. 4B. That is, in the case of FIG. 1A, the lower limits of the minimum sizes $L_1$ and $L_2$, are determined by considering the contact regulated in a direction along the side of the rectangular contact region. In contrast, in the layout of FIG. 4B, the direction in which the minimum margin for a misregistration lies is the diagonal direction of the rectangular contact region. Therefore, since the minimum sizes $L_1$ and $L_2$ need only be ensured along the diagonal direction of the rectangular contact region, it is possible to further miniaturize the rectangular contact region. This holds true also for the layout of FIG. 4A. In this case, since the minimum margin direction is a direction different from that of the side of the rectangular contact region, the minimum sizes $L_1$ and $L_2$ can be ensured in a smaller rectangular region.

In the above-mentioned embodiments, there is illustrated an example in which the N-type region in the substrate and the first polycrystalline silicon layer are connected to each other by the second polycrystalline silicon layer. However, the present invention is not limited to these embodiments and is applicable to a case where contact is achieved between three types of conductive layers. Also, in the above-mentioned embodiments, the contact region is defined by the contact window 16' formed in the insulating layer 16. Instead of this, the contact region can be defined by a pattern of the third conductive layer itself.

In accordance with the present invention, it is possible to reduce the area occupied by a contact structure in which two types of conductive layers arranged adjacent to each other are connected to each other by a third conductive layer pattern extending over these conductive layers. Therefore, the present invention is effective for enhancing the degree of integration of semiconductor devices.

We claim:
1. A semiconductor device having a semiconductor substrate, comprising:
a. connection structure including:
   a first conductive layer formed in or on the semiconductor substrate;
   a second conductive layer arranged adjacent to said first conductive layer; and
   a third conductive layer connecting said first conductiver layer to said second conductive layer by being in contact with said first and second conductive layers in a quadrangular contact region which is formed where said first conductive layer is adjacent to said second conductive layer and is defined so as to extend over said first and second conductive layers, the portion of said second conductive layer located within said quadrangular contact region having a pattern such that the width of said second conductive layer in a direction along one side or said quadrangular contact region is narrower at a predetermined section of said second conductive layer than at a section thereof spaced from the predetermined section along the longitudinal direction of said second conductive layer from the end thereof.

2. A semiconductor device according to claim 1, wherein said second conductive layer has a pattern with a square or rectangular shape, and wherein one corner portion of the square or rectangular shape is cut so as to have a triangular shape.

3. A semiconductor device according to claim 1, wherein said second conductive layer has a pattern with a square or rectangular shape, and wherein one corner of the square or rectangular shape is cut so as to have a smaller square or rectangular shape.

4. A semiconductor device according to claim 1, wherein said second conductive layer is made of polycrystalline silicon, molybdenum, or tungsten.

5. A semiconductor device having a semiconductor substrate, comprising:
a first conductive layer formed in the semiconductor substrate, a quadrangular contact region defining a contact window over at least a portion of said first conductive layer;
a second conductive layer arranged adjacent to said first conductive layer, said second conductive layer including a first portion located outside said contact window and a second portion located within said contact window, said second portion having a width at predetermined points of said second portion taken along the longitudinal direction thereof, which is less than the width of said first portion; and
a third conductive layer connecting said first conductive layer to said second conductive layer by being in contact with said first and second conductive layers in the quadrangular contact region.

6. A semiconductor device according to claim 5, wherein said second portion of said second conductive layer has a quadrangular shape with one corner of the quadrangular shape being deleted therefrom.

7. A semiconductor device according to claim 6, wherein said second conductive layer comprises polycrystalline silicon.

8. A semiconductor device according to claim 5, wherein said second portion of said second conductive layer has a quadrangular shape with a quadrangular corner of the quadrangular shape being deleted.

9. A semiconductor device according to claim 8, wherein said second conductive layer comprises polycrystalline silicon.

10. A semiconductor device according to claim 5, wherein said second portion of said second conductive layer has a triangular shape.

11. A semiconductor device according to claim 10, wherein said second conductive layer comprises polycrystalline silicon.

12. A semiconductor device having a semiconductor substrate, comprising:

a first conductive layer formed in the semiconductor substrate, a quadrangular contact region defining a contact window being formed on at least a portion of said first conductive layer;

a second conductive layer arranged adjacent to said first conductive layer, said second conductive layer including a first portion formed outside said contact window and a second portion formed within said contact window, the width of said second portion being variable; and a third conductive layer connecting said first conductive layer to said second conductive layer by being in contact with said first and second conductive layers in the quadrangular contact region.

* * * * *

UNITED STATES PATENT AND TRADEMARK OFFICE
CERTIFICATE OF CORRECTION

PATENT NO. : 4,549,199

DATED : OCTOBER 22, 1985

INVENTOR(S) : TAKAHIKO YAMAUCHI ET AL.

It is certified that error appears in the above-identified patent and that said Letters Patent is hereby corrected as shown below:

```
Col. 1, line 29, after "layer" insert --,--.

Col. 2, line 12, after "shape" insert --,--;
        line 29, "A-A;" should be --A-A';--.

Col. 4, line 5, after "region" insert --,--.
```

Signed and Sealed this

Eighteenth Day of February 1986

[SEAL]

Attest:

DONALD J. QUIGG

Attesting Officer

Commissioner of Patents and Trademarks